(12) United States Patent
Schwantes et al.

(10) Patent No.: US 7,560,334 B2
(45) Date of Patent: Jul. 14, 2009

(54) METHOD AND SYSTEM FOR INCORPORATING HIGH VOLTAGE DEVICES IN AN EEPROM

(75) Inventors: Stefan Schwantes, Heilbronn (DE); Volker Dudek, Brackenheim (DE); Michael Graf, Leutenbach (DE); Alan Renninger, San Jose, CA (US); James Shen, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 155 days.

(21) Appl. No.: 11/254,580

(22) Filed: Oct. 20, 2005

(65) Prior Publication Data

US 2007/0090432 A1    Apr. 26, 2007

(51) Int. Cl.
*H01L 21/8242* (2006.01)
(52) U.S. Cl. .................. 438/253; 438/387; 438/396; 257/E21.248; 257/E21.267; 257/E21.324; 257/E21.418; 257/E21.648
(58) Field of Classification Search .................. 438/253, 438/197, 199, 257, 387, 396, 509, 510, 514, 438/657, 954, 10
See application file for complete search history.

(56) References Cited

U.S. PATENT DOCUMENTS

| | | | |
|---|---|---|---|
| 5,411,905 A * | 5/1995 | Acovic et al. ............... 438/156 |
| 5,702,988 A * | 12/1997 | Liang ........................ 438/238 |
| 5,939,753 A * | 8/1999 | Ma et al. .................... 257/339 |
| 6,184,087 B1 * | 2/2001 | Wu ............................ 438/260 |
| 6,288,423 B1 * | 9/2001 | Sugaya ...................... 257/315 |
| 6,559,008 B2 * | 5/2003 | Rabkin et al. .............. 438/257 |
| 6,835,979 B1 * | 12/2004 | Liu et al. ................... 257/321 |

* cited by examiner

*Primary Examiner*—David Nhu
(74) *Attorney, Agent, or Firm*—Schwegman, Lundberg & Woessner P.A.

(57) ABSTRACT

A method and system for fabricating a stacked capacitor and a DMOS transistor are disclosed. In one aspect, the method and system include providing a bottom plate, an insulator, and an additional layer including first and second plates. The insulator covers at least a portion of the bottom plate and resides between the first and second top plates and the bottom plate. The first and second top plates are electrically coupled through the bottom plate. In another aspect, the method and system include forming a gate oxide. The method and system also include providing SV well(s) after the gate oxide is provided. A portion of the SV well(s) resides under a field oxide region of the device. Each SV well includes first, second, and third implants having a sufficient energy to provide the portion of the SV well at a desired depth under the field oxide region without significant additional thermal processing. A gate, source, and drain are also provided.

25 Claims, 5 Drawing Sheets

METHOD AND SYSTEM FOR INCORPORATING HIGH VOLTAGE DEVICES IN AN EEPROM

FIELD OF THE INVENTION

The present invention generally relates to semiconductor processing and more particularly to incorporating high voltage devices in low voltage CMOS processing.

BACKGROUND OF THE INVENTION

In certain applications of semiconductor technology it would be desirable to incorporate various high voltage components into semiconductor devices. In particular, semiconductor devices having both low voltage components and high voltage components in the same device may be useful. For example, it may be desirable to manufacture a semiconductor device such as an EEPROM including a high voltage capacitor and a high voltage diffuse MOS (DMOS) transistor.

Although it is desirable to have high voltage components in low voltage devices such as EEPROMs, one of ordinary skill in the art will readily recognize that there are drawbacks to doing so. In particular, processing methods for high voltage components may involve thermal treatments or other steps that adversely affect the fabrication of low voltage devices. In addition, portions of high voltage components may have requirements that may be incompatible with low voltage devices. For example, the insulator in a high voltage capacitor may be desired to have a breakdown voltage at or in excess of twenty-five or fifty volts. However, conventional low voltage devices such as EEPROMs utilize insulating layers having thicknesses that are insufficient to support such a breakdown voltage. In an EEPROM, for example, insulating layers have thicknesses that may be insufficient to provide the desired breakdown voltage for such a high voltage capacitor. Consequently, integrating high voltage components in a device utilizing processing techniques used in forming lower voltage may be problematic.

Accordingly, what is needed is a method and system for incorporating high voltage devices into processing appropriate for EEPROMs. The present invention addresses such a need.

BRIEF SUMMARY OF THE INVENTION

The present invention provides a method and system for fabricating high voltage device(s). In one aspect, the method and system provide a stacked capacitor. In this aspect, the method and system include providing a bottom plate and providing an insulator covering at least a portion of the bottom plate. In this aspect, the method and system also include providing a layer including a first top plate and a second top plate. The insulator resides between the first top plate and the bottom plate and between the second top plate and the bottom plate. The first top plate is electrically coupled to the second top plate through the bottom plate. In another aspect, the method and system provide a DMOS transistor in a semiconductor device including a field oxide region. In this aspect, the method and system include providing a gate oxide. The method and system also include providing at least one high voltage (SV) well after the gate oxide is provided. At least a portion of the SV well(s) resides under the field oxide region. Providing the SV well(s) further includes providing a first implant, a second implant, and a third implant. Each of the implants has a sufficient energy to provide the portion of the at least one SV well at a desired depth under the field oxide region without significant additional thermal processing. The method and system also include forming a gate on the gate oxide, providing a source, and providing a drain.

According to the method and system disclosed herein, the present invention provides high voltage devices, such as capacitors and DMOS transistors, in low voltage processes.

DETAILED DESCRIPTION OF THE INVENTION

The present invention generally relates to semiconductor processing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for fabricating high voltage device(s). In one aspect, the method and system provide a stacked capacitor. In this aspect, the method and system include providing a bottom plate and providing an insulator covering at least a portion of the bottom plate. In this aspect, the method and system also include providing a layer including a first top plate and a second top plate. The insulator resides between first top plate and the bottom plate and between the second top plate and the bottom plate. The first top plate is electrically coupled to the second top plate through the bottom plate. In another aspect, the method and system provide a DMOS transistor in a semiconductor device including a field oxide region. In this aspect, the method and system include providing a gate oxide. The method and system also include providing at least one SV well after the gate oxide is provided. At least a portion of the SV well(s) resides under the field oxide region. Providing the SV well(s) further includes providing a first implant, a second implant, and a third implant. Each of the implants has a sufficient energy to provide the portion of the at least one SV well at a desired depth under the field oxide region without significant additional thermal processing. The method and system also include forming a gate on the gate oxide, providing a source, and providing a drain.

The present invention will be described in terms of devices having particular components or particular sizes. However, one of ordinary skill in the art will readily recognize that other and/or additional components and other and/or additional sizes of components could be used. In addition, the present invention is described in the context of particular methods. One of ordinary skill in the art will readily recognize that for ease of explanation, steps may be omitted or merged in the methods described.

Figure 1:
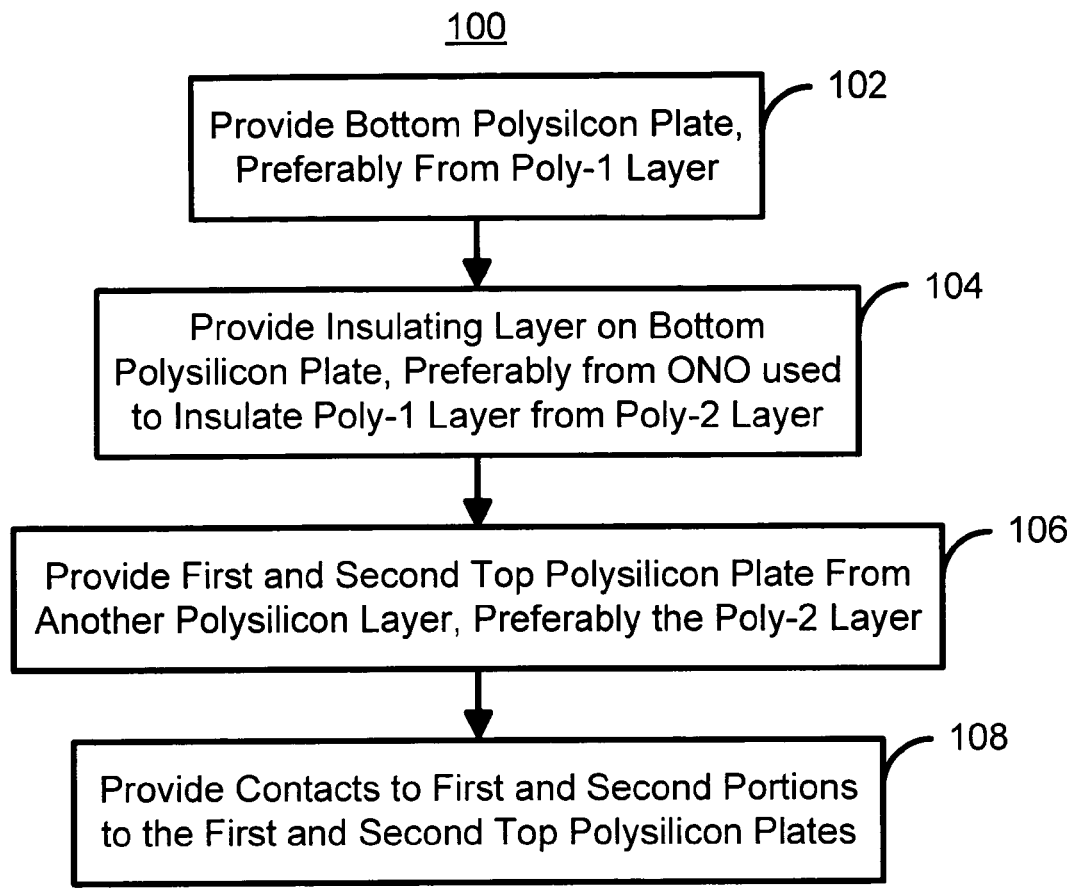
FIG. 1 is a flow chart depicting one embodiment of a method for providing a stacked capacitor in a lower voltage device such as an EEPROM.

FIG. 1 is a flow chart depicting one embodiment of a method 100 for providing a stacked capacitor in a lower voltage device such as an EEPROM. The method 100 is described in the context of a stacked capacitor formed using polysilicon layers, particularly the first and second polysilicon layers. However, one of ordinary skill in the art will readily recognize that other conducting materials and layers could be used such as but not limited to aluminum, copper, and silicide. A bottom polysilicon plate is provided, via step 102. In a preferred embodiment, the bottom polysilicon plate is part of the first polysilicon (poly-1) layer. Also in a preferred embodiment, the bottom polysilicon plate is provided on a field oxide region. An insulator is provided on the bottom polysilicon plate, via step 104. The insulator is preferably an ONO layer used in insulating the poly-1 layer from the second polysilicon (poly-2) layer of an EEPROM stack. Thus, in a preferred embodiment, the ONO layer includes a six to ten nanometer bottom oxide layer, a twelve to eighteen nanometer silicon nitride layer, and a four to seven nanometer top oxide layer. However, in another embodiment, the thicknesses of the layers of the ONO layer may differ or another insulator may be used. First and second top polysilicon plates are formed from another polysilicon layer, via step 106. In a preferred embodiment, the polysilicon layer is the poly-2 layer. Consequently, the first and second top polysilicon plates are preferably formed by transferring a pattern to the poly-2 layer. The first and second top polysilicon plates of the poly-2 layer are electrically connected through the bottom polysilicon plate and are thus preferably physically separated. The first and second top polysilicon plates thus act as top plates of capacitors connected in series through the bottom polysilicon plate. Contacts are formed on the first and second portions, via step 108. Thus, a stacked capacitor may be formed.

Figure 2:
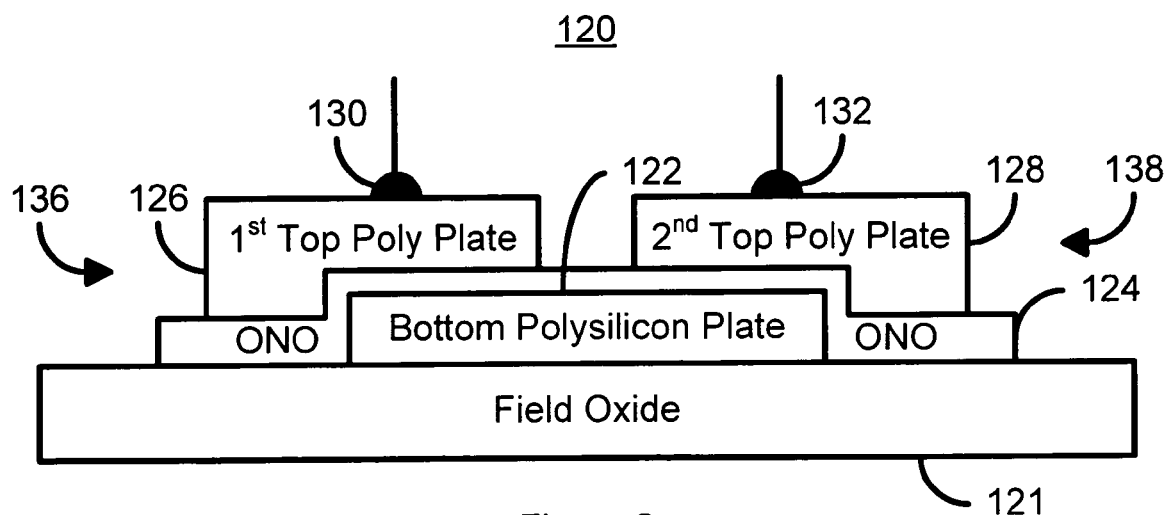
FIG. 2 is a diagram depicting a side view of one embodiment of a stacked capacitor formed in accordance with the present invention.

FIG. 2 is a diagram depicting a side view of one embodiment 120 of a stacked capacitor formed in accordance with the present invention and using the method 100. The stacked capacitor 120 is depicted as being formed on the field oxide region 121. However, in another embodiment, the stacked capacitor 120 may reside on another structure. The stacked capacitor 120 includes bottom polysilicon plate 122, an insulator 124, and top polysilicon plates 126 and 128 formed from another polysilicon layer. Contacts 130 and 132 are also shown. In the embodiment shown in FIG. 2, the insulator 124 covers and substantially surrounds the bottom polysilicon plate 122. In addition, the bottom polysilicon plate 122 is preferably part of the poly-1 layer, while the top polysilicon plates 126 and 128 are preferably part of the poly-2 layer. As can be seen in FIG. 2, the stacked capacitor 120 preferably includes two capacitors 136 and 138 connected in series. The first capacitor 136 is formed by the first top polysilicon plate 126, the insulator 124, and the bottom polysilicon plate 122. The second capacitor 138 is formed by the bottom polysilicon plate 122, the insulator 124, and the second top polysilicon plate 128. In addition, the top polysilicon plates 126 and 128, and thus the capacitors 136 and 138 are coupled in series through the bottom polysilicon plate 122.

Figure 3:
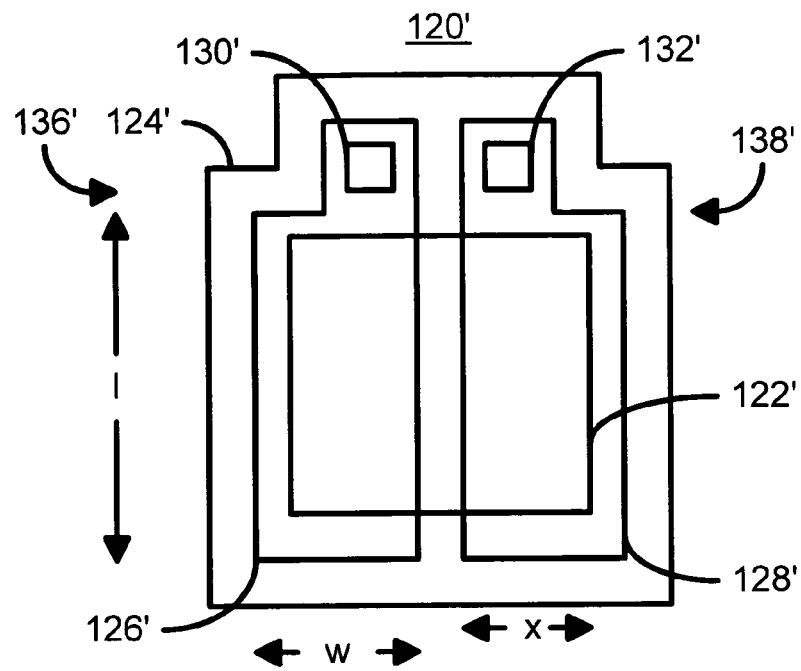
FIG. 3 is a diagram depicting a plan view of one embodiment of a stacked capacitor formed in accordance with the present invention.

FIG. 3 is a diagram depicting a plan view of one embodiment of a stacked capacitor 120' formed in accordance with the present invention. The stacked capacitor 120' is analogous to the stacked capacitor 120. Consequently, portions of the stacked capacitor 120' are labeled in a similar manner to the portions of the stacked capacitor 120. Consequently, the stacked capacitor 120' includes bottom polysilicon plate 122', an insulator 124', and top polysilicon plates 126' and 128' of the poly-2 layer. Two contacts 130' and 132' are also provided. The insulator layer 124' may, but need not, extend beyond the first and second top polysilicon plates 126' and 128' by at least 0.1 µm. The distance between the edge of the bottom polysilicon plate 122' and the contact 130' or 132' is sufficient to ensure that the bottom polysilicon plate 122' does not make electrical contact with the contact 130' or 132' and depends upon the device and technology. In one embodiment, this distance is at least 0.5 µm. The length, l, of the lower portion of the outside edge of the first and second top polysilicon plates 126' and 128' depends upon the desired capacitance of the device and, one the embodiment is 2.450 µm. The width, w, of the first and second top polysilicon plates 126' and 128', respectively, depends upon the desired capacitance of the device and, in one embodiment, is 1.050 µm. The spacing between the first and second top polysilicon plates 126' and 128' depends upon the desired capacitance of the device and, in one embodiment, is 0.7 µm. The overlap, x, between the bottom polysilicon plate 122' and the first top polysilicon plate 126' or the second top polysilicon plate 128' depends upon the desired capacitance of the device and, in one embodiment, is 0.35 µm.

Figure 4:
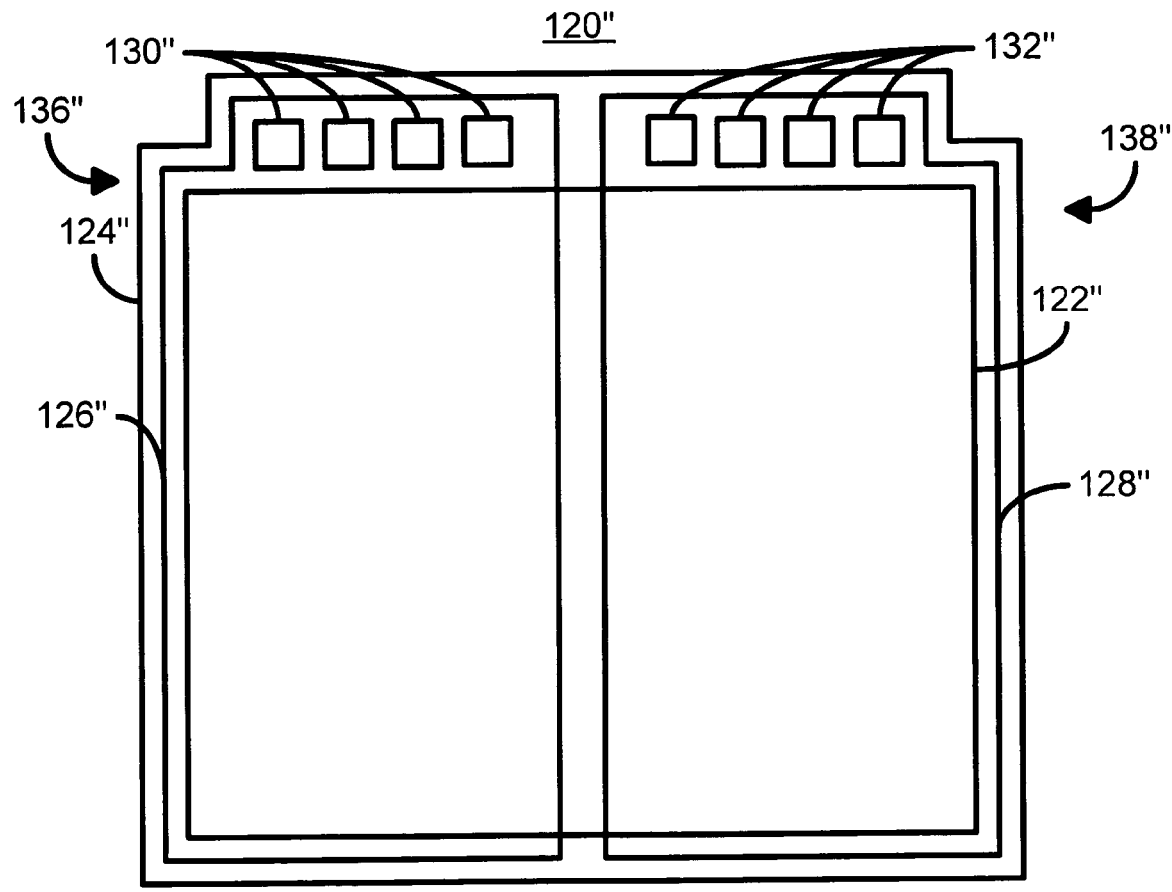
FIG. 4 is a diagram depicting a plan view of another embodiment of a stacked capacitor formed in accordance with the present invention.

FIG. 4 is a diagram depicting a plan view of another embodiment of a stacked capacitor 120" formed in accordance with the present invention. The stacked capacitor 120" is analogous to the stacked capacitors 120 and 120'. Consequently, portions of the stacked capacitor 120" are labeled in a similar manner to the portions of the stacked capacitor 120. Consequently, the stacked capacitor 120" includes a bottom polysilicon plate 122", an insulator 124", and top polysilicon plates 126" and 128". Preferably, the bottom polysilicon plate 122" and the top polysilicon plates 126" and 128" are formed from the poly-1 and poly-2 layers, respectively. In this embodiment, four contacts 130" and four contacts 132" are also provided. As can be seen in FIG. 4, the stacked capacitor 120" can be scaled. Consequently, the stacked capacitor 120" is essentially a larger version of the stacked capacitor 120'.

The stacked capacitors 120, 120', and 120" have a high breakdown voltage despite being formed using components already used in a low voltage device, such as an EEPROM. In a preferred embodiment, the stacked capacitors 120, 120', and 120" are formed from the poly-1 layer, the poly-2 layer and the ONO layer insulating the poly-1 layer from the poly-2 layer. The stacked capacitors 120, 120', and 120" each includes capacitors 136 and 138, 136' and 138', and 136" and 138", respectively, coupled in series through the bottom polysilicon plate 122, 122', and 122", respectively. The capacitors 136 and 138, 136' and 138', and 136" and 138" individually may have an insufficient breakdown voltage. However, because of the series coupling, the voltage across the insulator

124, 124', or 124", is half that of the voltage across the entire stacked capacitor 120, 120', or 120", respectively. Thus, the stacked capacitors 120, 120', and 120", therefore, preferably may support a voltage that is approximately at least twice the voltage between the plates of the capacitor 136 or 138, 136' or 138', or 136" or 138". Stated differently, the voltage for the stacked capacitor 120, 120', or 120" may be approximately at least twice the voltage between the polysilicon layers. Consequently, the stacked capacitors 120, 120', 120" may have a high breakdown voltage, may be relatively easily incorporated into low voltage devices such as EEPROMs, and may be formed using elements in such devices.

Figure 5:
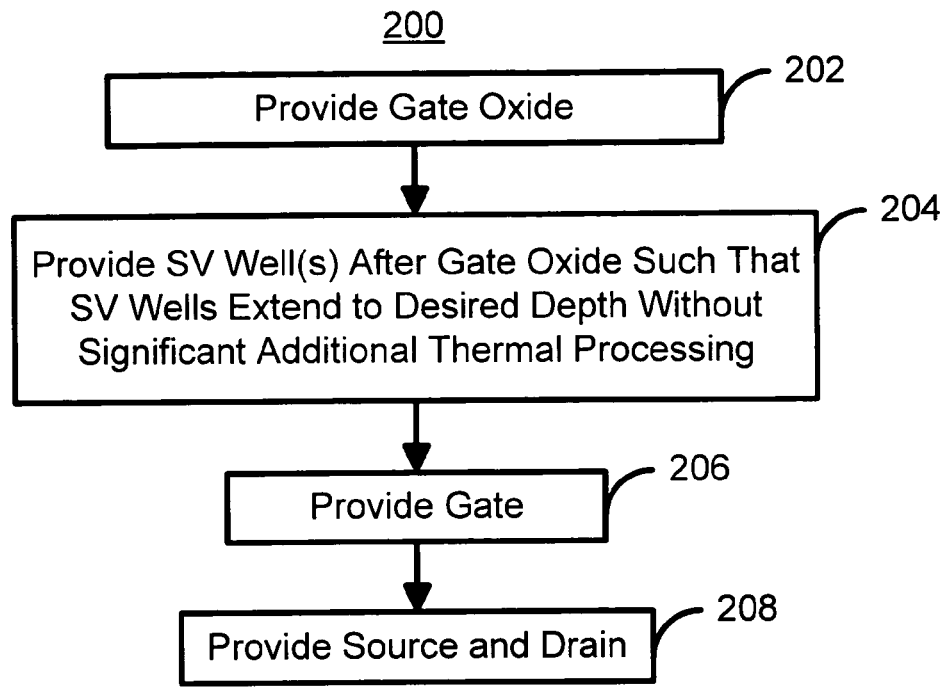
FIG. 5 is a flow chart depicting one embodiment of a method for providing a DMOS transistor in a lower voltage device such as an EEPROM.

FIG. 5 is a flow chart depicting one embodiment of a method 200 for providing a DMOS transistor in a lower voltage device such as an EEPROM. The method 200 preferably commences after an active area of the region has been defined and oxides such as tunnel, field, and certain gate oxides have been formed, after a poly-1 layer has been provided, and after wells for any charge pump devices have been formed. A gate oxide capable of sustaining a higher voltage is formed, via step 202. The gate oxide formed in step 202 is preferably a thick gate oxide having a thickness of at least twenty nanometers and, in one embodiment, approximately twenty-seven nanometers. At least one SV well is provided after formation of the gate oxide, via step 204. In one embodiment, the SV well(s) are provided before other structures for the DMOS transistor are formed. In a preferred embodiment, the SV well(s) are provided substantially immediately after (e.g. in the next processing step) formation of the gate oxide in step 202. Step 204 is performed such that the SV well(s) have the desired depth and shape without requiring significant additional thermal processing such as a drive step or anneal that may adversely affect the device of which the DMOS transistor is a part. Thus, in a preferred embodiment, step 204 is performed such that the formation of the SV well(s) having certain desired features, including the desired location and depth, can be accomplished without thermal treatments that may adversely affect an EEPROM. As used herein, therefore, significant additional thermal processing includes thermal processing which may adversely affect the device of which the transistor being formed is a part. In one embodiment, significant thermal processing includes processing using temperatures above 900° C. In another embodiment, significant thermal processing includes processing that occurs above 900° C. for approximately thirty minutes or more. Consequently, step 204 preferably includes providing three implants for each type of well, each implant having the desired type and a sufficient energy for the implanted impurities to reside at the desired location. The gate for the DMOS transistor is formed, via step 206. The source and drain for the DMOS transistor are also provided, via step 208.

Figure 6:
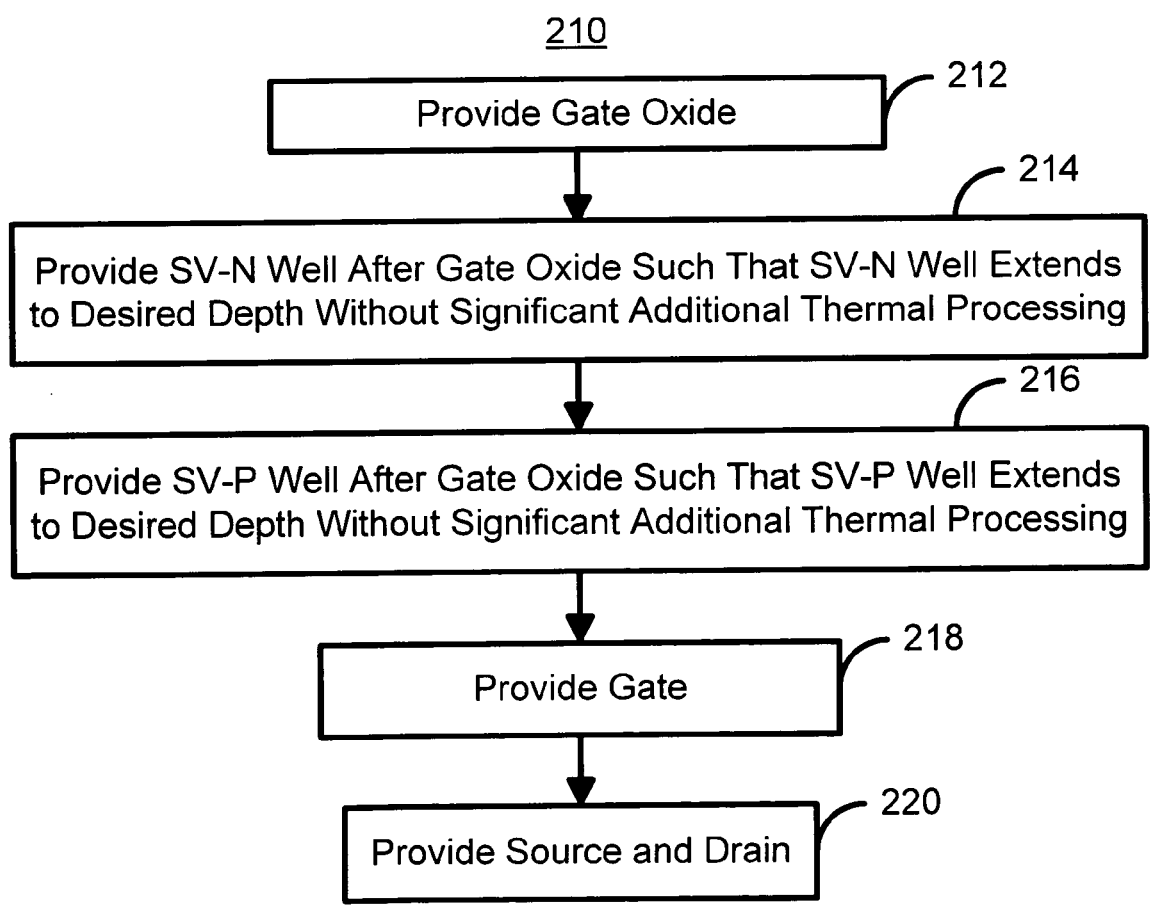
FIG. 6 is a flow chart depicting another embodiment of a method for providing a DMOS transistor in a lower voltage device such as an EEPROM.

FIG. 6 is a flow chart depicting another embodiment of a method 210 for providing a DMOS transistor in a lower voltage device such as an EEPROM. The method 210 preferably commences after an active area of the region has been defined and oxides such as tunnel, field, and certain gate oxides have been formed, after a poly-1 layer has been provided, and after wells for any charge pump devices have been formed. A gate oxide capable of sustaining a higher voltage is formed, via step 212. The gate oxide formed in step 212 is preferably a thick gate oxide having a thickness of at least twenty nanometers and, in one embodiment, approximately twenty-seven nanometers. An SV-N well is provided after formation of the gate oxide, via step 214. An SV-P well is also provided after formation of the gate oxide, via step 216. In one embodiment, the SV wells are provided in steps 214 and 216 before other structures for the DMOS transistor are formed. In a preferred embodiment, the SV wells are provided substantially immediately after (e.g. in the next processing steps) formation of the gate oxide in step 212. Steps 214 and 216 are performed such that the SV wells have the desired depth without requiring significant additional thermal processing such as a drive step or anneal that may adversely affect the device of which the DMOS transistor is a part. Thus, in a preferred embodiment, steps 214 and 216 are performed such that the formation of the SV wells having certain desired features, including the desired locations and depths, can be accomplished without significant thermal treatments that may adversely affect an EEPROM. Consequently, steps 214 and 216 preferably include providing three implants for each type of well, each implant has the desired type and at least one implant has a sufficient energy for the implanted impurities to reside at the desired location. For example, in one embodiment, the SV-N well is formed using a $P^+$ implant of $3 \times 10^{12}$ and 2 MeV, a $P^+$ implant of $2 \times 10^{12}$ and 230 keV, and either a $BF_2^+$ implant of $1.3 \times 10^{12}$ and 50 keV or $B^+$ implant of $1.3 \times 10^{12}$ and 20 keV. In one embodiment, the SV-P well is formed using a $B^+$ implant of $4 \times 10^{12}$ and 500 keV, a $B^+$ implant of $3 \times 10^{12}$ and 70 keV, and a $B^+$ implant of $3.8 \times 10^{12}$ and 20 keV or a $BF_2$ implant of $3.8 \times 10^{12}$ and 50 keV. In the embodiment described, the doses are within plus or minus one hundred percent, while the energies may be plus or minus fifty percent. The implants described above are for one embodiment. The implantation, including the species and energy, may be varied. For example, the third implant described above (such as the $B^+$ or $BF_2$ implant of the SV-N well) may be replaced by a P implant of 40-70 keV or an As implant of 50-80 keV. In another embodiment, the P implants may be 150-250 keV or 1-3 MeV, the $B^+$ implant may be 15-30 keV, and the $BF_2$ implant may be 50-80 keV. The gate for the DMOS transistor is formed, via step 218. The source and drain for the DMOS transistor are also provided, via step 220.

Figure 7:
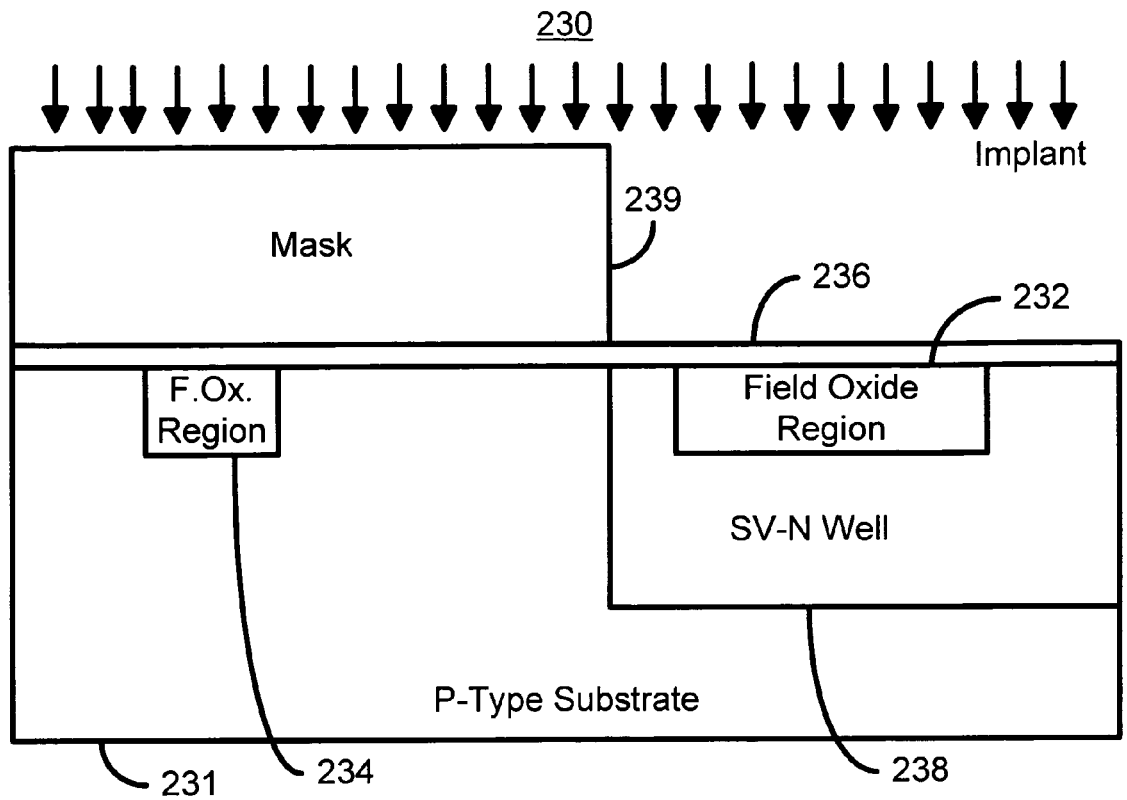
FIG. 7 is a diagram depicting a side view of one embodiment of a DMOS transistor in accordance with the present invention during SV-N well implantation during fabrication.

FIG. 7 is a diagram depicting a side view of one embodiment of a portion of a DMOS transistor 230 in accordance with the present invention during SV-N well implantation during fabrication. The DMOS transistor 230 is a NDMOS device. The DMOS transistor 230 is formed in a P-type substrate 231. The field oxide regions 232 and 234 are previously formed and a portion of the DMOS transistor 230 covered using mask 239. The DMOS transistor 230 includes a gate oxide 236 and SV-N well 238 being implanted.

Figure 8:
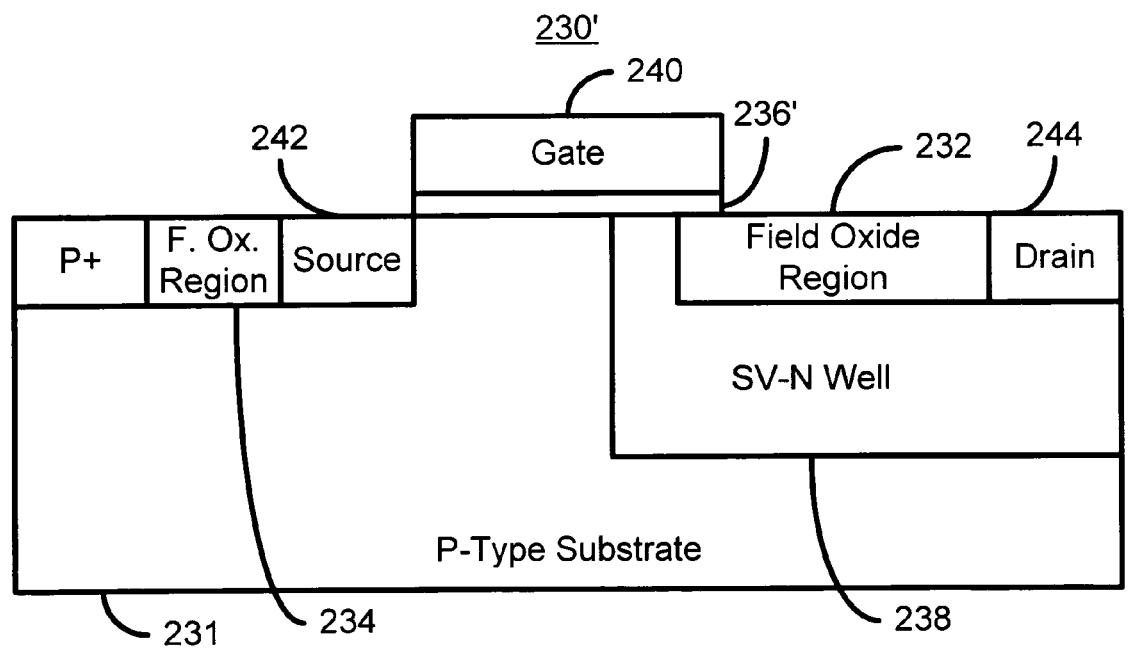
FIG. 8 is a diagram depicting a side view of one embodiment of a DMOS transistor in accordance with the present invention.

FIG. 8 is a diagram depicting a side view of one embodiment of the DMOS transistor 230' in accordance with the present invention after fabrication is completed. The DMOS transistor 230' is a NDMOS device. Thus, the DMOS transistor 230' includes SV-N well 238, a gate 240 separated from the substrate 231 and SV-N well 238 by the gate oxide 236', source 242, and drain 244.

Figure 9:
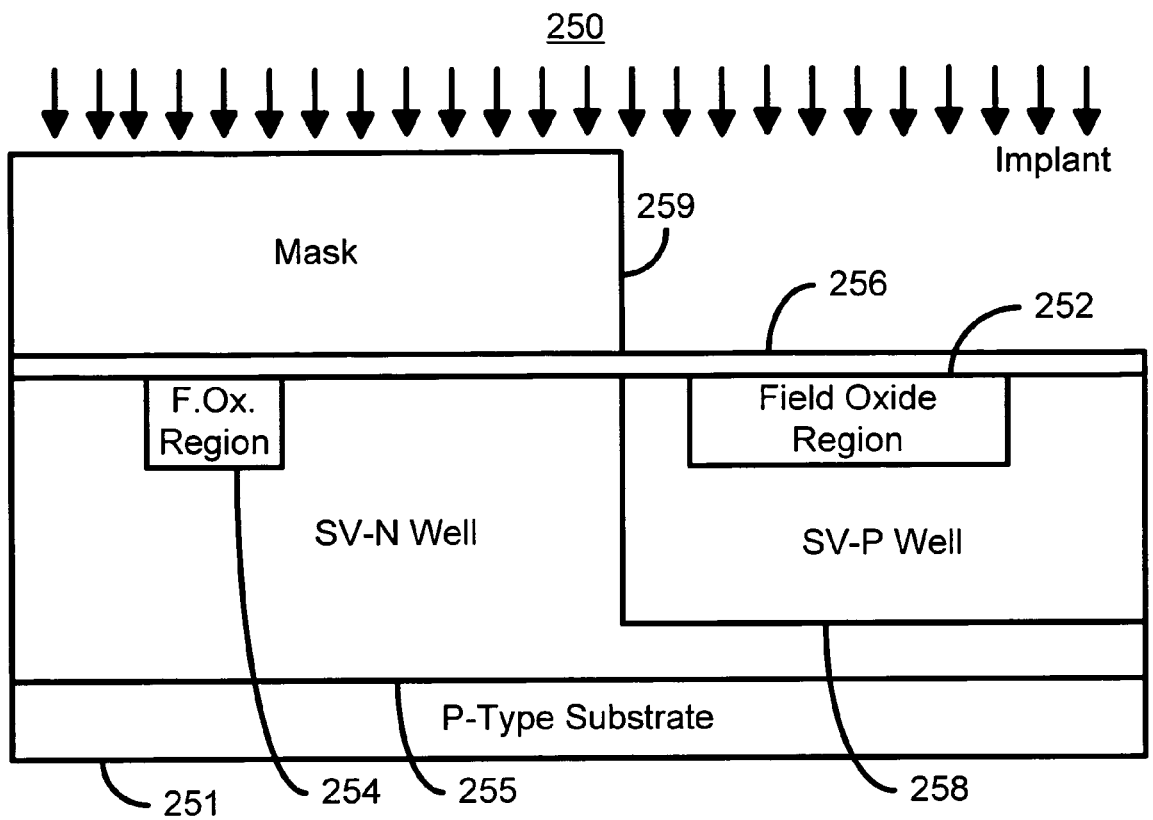
FIG. 9 is a diagram depicting a side view of one embodiment of a DMOS transistor in accordance with the present invention during SV-P well implantation during fabrication.

FIG. 9 is a diagram depicting a side view of one embodiment of a DMOS transistor 250 in accordance with the present invention during SV-P well implantation during fabrication. The DMOS transistor 250 is a PDMOS device. The DMOS transistor 250 is formed in a P-type substrate 251. The field oxide regions 252 and 254 are previously formed and a portion of the DMOS transistor 250 covered using mask 259. The DMOS transistor 250 includes a gate oxide 256 and SV-P well 258 being implanted. In addition, another SV-N well 255 has been provided.

Figure 10:
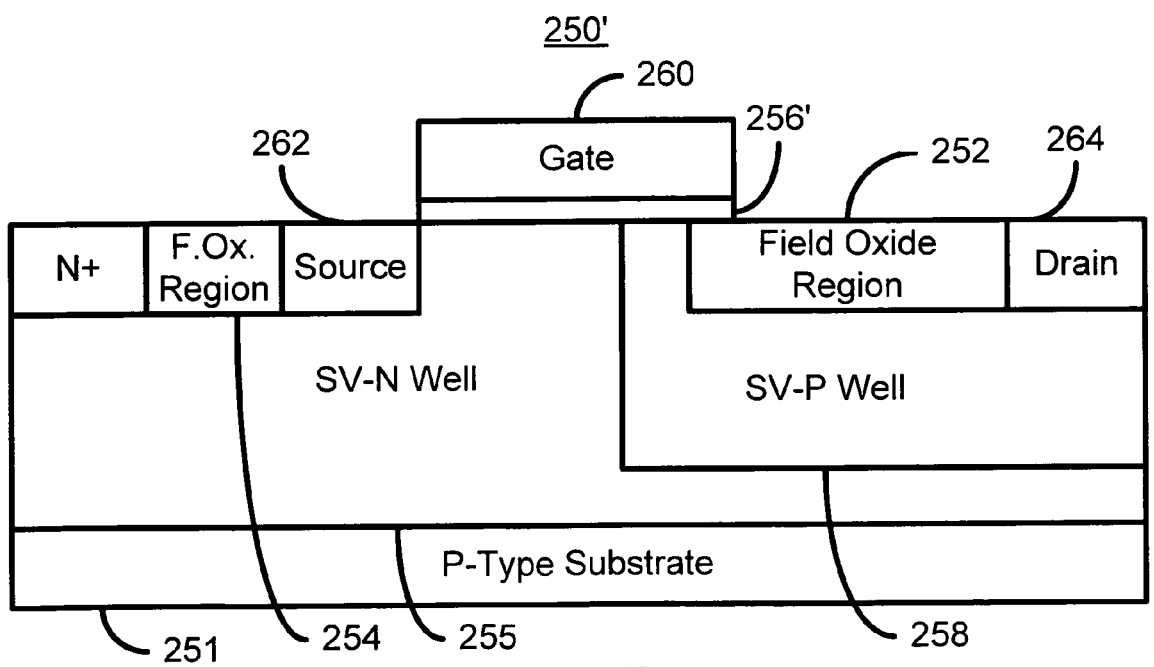
FIG. 10 is a diagram depicting a side view of one embodiment of a DMOS transistor in accordance with the present invention.

FIG. 10 is a diagram depicting a side view of one embodiment of a DMOS transistor 250 in accordance with the present invention. The DMOS transistor 250' is a PDMOS device. Thus, the DMOS transistor 250' includes SV-N well 255, SV-P well 258, a gate 260 separated from the SV-N well 255 and the SV-P well 258 by the gate oxide 256', source 262, and drain 264.

Thus, the DMOS transistors 230' and 250' are capable of supporting a high voltage. Furthermore, because the SV wells 238, 258, and preferably 255 are provided such that significant subsequent thermal treatments such as drive steps or anneals steps are not required, formation of the DMOS transistors 230' and 250' does not adversely affect formation of the low voltage device, such as an EEPROM. Consequently, the DMOS transistors 230' and 250' may be incorporated into a low voltage device.

A method and system for fabricating high voltage components in low voltage devices, such as EEPROMs have been described. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for providing a stacked capacitor, comprising:
providing a bottom plate;
providing an insulator on at least a portion of the bottom plate;
forming a layer including a first top plate and a second top plate that are physically separate from each other, the first top plate and the second top plate being positioned over the bottom plate and separated from the bottom plate by the insulator, the first top plate and the second top plate extending laterally outside the bottom plate, the first top plate being electrically coupled with the second top plate through the bottom plate.

2. The method of providing a stacked capacitor according to claim 1 wherein the bottom plate is electrically floating.

3. The method of providing a stacked capacitor according to claim 1 further comprising:
providing a first contact coupled with the first top plate; and
providing a second contact coupled with the second top plate.

4. The method of providing a stacked capacitor according to claim 1, wherein providing the bottom plate includes fabricating a polysilicon plate, and wherein forming the layer includes forming the first top plate and the second top plate with polysilicon.

5. The method of providing a stacked capacitor according to claim 4 wherein providing the insulator includes providing an ONO layer.

6. The method of providing a stacked capacitor according to claim 4 wherein the bottom polysilicon plate is part of a first polysilicon layer.

7. The method of providing a stacked capacitor according to claim 4 wherein the first top polysilicon plate and the second top polysilicon plate are part of a second polysilicon layer.

8. The method of providing a stacked capacitor according to claim 1, wherein providing the insulator includes fabricating an ONO layer including a bottom oxide layer with a thickness of substantially 8.5 nm.

9. The method of providing a stacked capacitor according to claim 1, wherein forming the layer includes forming a first contact to the first top plate.

10. The method of providing a stacked capacitor according to claim 9, wherein forming the layer includes forming a second contact to the second top plate.

11. A method for providing a DMOS transistor in a semiconductor device including a field oxide region, the method comprising:
providing a gate oxide;
providing at least one high voltage well after the gate oxide is provided, at least a portion of the at least one high voltage well residing under the field oxide region, the at least one high voltage well providing further including providing a first implant, a second implant, and a third implant, each of the plurality of implants having a sufficient energy to provide the at least the portion of the at least one high voltage well at a desired depth under the field oxide region without significant additional thermal processing;
forming a gate on the gate oxide;
providing a source; and
providing a drain.

12. The method of providing a DMOS transistor in a semiconductor device according to claim 11 wherein the at least one high voltage well providing further includes: providing a high voltage-N well.

13. The method of providing a DMOS transistor in a semiconductor device according to claim 12 wherein the first implant includes a first $P^+$ implant, the second implant includes a second $P^+$ implant, and the third implant includes a $BF_2$ implant.

14. The method of providing a DMOS transistor in a semiconductor device according to claim 12 wherein the first implant includes a first $P^+$ implant, the second implant includes a second $P^+$ implant, and the third implant includes a $B^+$ implant.

15. The method of providing a DMOS transistor in a semiconductor device according to claim 12 wherein the first implant includes a first $P^+$ implant, the second implant includes a second $P^+$ implant, and the third implant includes a third $P^+$ implant.

16. The method of providing a DMOS transistor in a semiconductor device according to claim 12 wherein the first implant includes a first $P^+$ implant, the second implant includes a second $P^+$ implant, and the third implant includes an As implant.

17. The method of providing a DMOS transistor in a semiconductor device according to claim 11 wherein the at least one high voltage well providing further includes: providing a high voltage-P well.

18. The method of providing a DMOS transistor in a semiconductor device according to claim 17 further comprising:
providing a high voltage -N well, the high voltage-P well residing in a portion of the high voltage-N well.

19. The method of providing a DMOS transistor in a semiconductor device according to claim 18 wherein the first implant includes a first $B^+$ implant, the second implant includes a second $B^+$ implant, and the third implant includes a third $B^+$ implant.

20. The method of providing a DMOS transistor in a semiconductor device according to claim 11 wherein the at least one high voltage well is provided before another structure in the DMOS transistor is formed.

21. The method of providing a DMOS transistor in a semiconductor device according to claim 20 wherein the at least one high voltage well providing occurs immediately after the gate oxide is provided.

22. The method of providing a DMOS transistor in a semiconductor device according to claim 11 wherein the DMOS transistor is provided such that at least fifty volts may be supported between the drain and the gate or source.

23. The method of providing a DMOS transistor in a semiconductor device according to claim 11 wherein the significant additional thermal processing includes thermal processing at temperatures above 900° C.

24. The method of providing a DMOS transistor in a semiconductor device according to claim 11 wherein the significant additional thermal processing includes thermal processing at temperatures above 900° C. for at least 30 minutes.

25. A method for providing a DMOS transistor semiconductor device including at least one field oxide region, the method comprising:

providing a gate oxide;

providing at least one high voltage-N well and at least one high voltage-P well after the gate oxide is provided and before another structure in the DMOS transistor is formed, at least a portion of the at least one high voltage-N well residing under one of the at least one field oxide region, the at least one high voltage-N well providing further implants including providing a first implant, a second implant, and a third implant, at least one of the first, second and third implants having an energy sufficient to provide the at least the portion of the at least one high voltage-N well at a desired depth under the one of the at least one field oxide region without significant additional thermal processing, at least a portion of the at least one high voltage-P well residing under another of the at least one field oxide region, the at least one high voltage-P well providing further implants including providing a fourth implant, a fifth implant, and a sixth implant, at least one of the fourth, fifth, and sixth implants having a sufficient energy to provide the a least the portion of the at least one high voltage-P well at a desired depth under the another of the at least one field oxide region without the significant additional thermal processing;

forming a gate on the gate oxide;

providing a source; and providing a drain.

* * * * *

UNITED STATES PATENT AND TRADEMARK OFFICE
CERTIFICATE OF CORRECTION

PATENT NO. : 7,560,334 B2  Page 1 of 1
APPLICATION NO. : 11/254580
DATED : July 14, 2009
INVENTOR(S) : Schwantes et al.

It is certified that error appears in the above-identified patent and that said Letters Patent is hereby corrected as shown below:

In column 8, line 49, in Claim 18, delete "voltage -N" and insert -- voltage-N --, therefor.

In column 10, line 11, in Claim 25, delete "a least" and insert -- at least --, therefor.

Signed and Sealed this

Twelfth Day of January, 2010

David J. Kappos
*Director of the United States Patent and Trademark Office*